(12) United States Patent
Lu et al.

(10) Patent No.: US 11,394,010 B2
(45) Date of Patent: Jul. 19, 2022

(54) DISPLAY SUBSTRATE, METHOD FOR MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Guanyu Lu, Beijing (CN); Dawei Wang, Beijing (CN); Haiping Zhao, Beijing (CN); Ruiqi Xiu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 126 days.

(21) Appl. No.: 16/825,837

(22) Filed: Mar. 20, 2020

(65) Prior Publication Data
US 2021/0005840 A1 Jan. 7, 2021

(30) Foreign Application Priority Data
Jul. 4, 2019 (CN) .......................... 201910598481.3

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3246* (2013.01); *H01L 51/0018* (2013.01); *H01L 51/56* (2013.01); *H01L 2227/323* (2013.01)

(58) Field of Classification Search
CPC ... H01L 51/5253–5256; H01L 27/3246; H01L 51/0018; H01L 51/56; H01L 2227/323
See application file for complete search history.

(56) References Cited

U.S. PATENT DOCUMENTS

2014/0346468 A1* 11/2014 Kim ................... H01L 27/3246
257/40
2016/0043150 A1* 2/2016 Wang .................... H01L 51/56
257/40
(Continued)

FOREIGN PATENT DOCUMENTS

CN 107104130 A 8/2017
CN 107565056 A 1/2018
(Continued)

OTHER PUBLICATIONS

CN-109166882-A, English translation, Jan. 8, 2018, pp. 1-15 (Year: 2018).*
(Continued)

*Primary Examiner* — Shaun M Campbell
(74) *Attorney, Agent, or Firm* — Muncy, Geissler, Olds & Lowe, P.C.

(57) ABSTRACT

A display substrate, a method for manufacturing the same and a display device are provided. The display substrate includes a base, a pixel definition layer disposed on the base, and a light-emitting unit disposed in a pixel opening region defined by the pixel definition layer; the display substrate further includes: a diversion channel provided on a surface of the pixel definition layer that is away from the base; and an encapsulation layer covering the light-emitting unit and the pixel definition layer, wherein the encapsulation layer fills the diversion channel. The display substrate in the present disclosure is used for displaying an image.

11 Claims, 6 Drawing Sheets

(51) Int. Cl.
   *H01L 51/00*   (2006.01)
   *H01L 51/56*   (2006.01)

(56) References Cited

U.S. PATENT DOCUMENTS

| | | | |
|---|---|---|---|
| 2018/0342563 A1* | 11/2018 | You | H01L 51/56 |
| 2019/0198587 A1* | 6/2019 | Park | H01L 51/5253 |
| 2020/0035944 A1 | 1/2020 | Wang | |
| 2020/0243801 A1* | 7/2020 | Xu | H01L 51/5275 |
| 2021/0028254 A1* | 1/2021 | Yan | H01L 51/5253 |
| 2021/0143221 A1* | 5/2021 | Kishimoto | H01L 51/5256 |

FOREIGN PATENT DOCUMENTS

| | | | | |
|---|---|---|---|---|
| CN | 109166882 | * | 1/2018 | H01L 51/5253 |
| CN | 108538892 A | | 9/2018 | |
| CN | 109037475 A | | 12/2018 | |
| CN | 109065743 A | | 12/2018 | |
| CN | 109671738 A | | 4/2019 | |
| CN | 109817692 A | | 5/2019 | |

OTHER PUBLICATIONS

Office Action corresponding to Chinese application No. 201910598481.3 dated Feb. 22, 2021. (pp. 24).

* cited by examiner

DISPLAY SUBSTRATE, METHOD FOR MANUFACTURING THE SAME AND DISPLAY DEVICE

CROSS-REFERENCE TO RELATED APPLICATION

This disclosure claims a priority to Chinese Patent Application No. 201910598481.3 filed on Jul. 4, 2019, the disclosure of which is incorporated in its entirety by reference herein.

TECHNICAL FIELD

The present disclosure relates to the field of display technologies, in particular to a display substrate, a method for manufacturing the same and a display device.

BACKGROUND

Organic light-emitting diode (OLED) display devices have attracted much attention due to their beneficial properties, such as self-illumination, high contrast, and fast response speed. The OLED display device mainly emits light through its internal light-emitting unit. The light-emitting unit generally includes an anode and a cathode located opposite to each other, and an organic light-emitting material layer disposed between the anode and the cathode. In operation, the organic light emitting material layer is controlled to emit light by writing a driving signal to the anode and the cathode. However, in practical production and application, the organic light-emitting material layer tends to fail due to moisture and oxygen erosion. Therefore, a thin film encapsulation layer is generally formed on the light-emitting unit, and the thin film encapsulation layer isolates the light-emitting unit from external moisture and oxygen, thereby ensuring a service life of the OLED display device.

However, the encapsulation performance of encapsulation layer manufactured according to the related art needs to be improved.

SUMMARY

A display substrate is provided in a first aspect of the present disclosure. The display substrate includes a base, a pixel definition layer disposed on the base, and a light-emitting unit disposed in a pixel opening region defined by the pixel definition layer, the display substrate further includes:
 a diversion channel provided on a surface of the pixel definition layer that is away from the base; and
 an encapsulation layer covering the light-emitting unit and the pixel definition layer, wherein the encapsulation layer fills the diversion channel.

Optionally, the diversion channel includes a groove structure.

Optionally, the diversion channel connects adjacent pixel opening regions.

Optionally, the adjacent pixel opening regions include a target pixel opening region and a non-target pixel opening region, and an opening area of the non-target pixel opening region is larger than an opening area of the target pixel opening region.

Optionally, an orthographic projection of the diversion channel on the base surrounds an orthographic projection of the target pixel opening region on the base, and a depth of the diversion channel in a direction perpendicular to the base is gradually increased along a first direction; the first direction includes a direction from the non-target pixel opening region to the target pixel opening region.

Optionally, the light-emitting unit includes a red light-emitting unit, a green light-emitting unit, and a blue light-emitting unit, the green light-emitting unit is located in the target pixel opening region, and both the red light-emitting unit and the blue light-emitting unit are located in the non-target pixel opening region.

Optionally, a maximum thickness of the pixel definition layer in a direction perpendicular to the base ranges from 1.5 μm to 2 μm, and a maximum depth of the groove structure in the direction perpendicular to the base ranges from 0.5 μm to 1 μm.

Optionally, a width of the groove structure in a direction perpendicular to an extending direction of the groove structure ranges from 1 μm to 1.5 μm.

Optionally, the display substrate further includes:
 a thin film transistor array layer disposed between the base and the pixel definition layer, wherein the thin film transistor array layer includes a driving transistor in a one-to-one correspondence with the light-emitting unit;
 the light-emitting unit includes an anode pattern and a cathode pattern disposed oppositely, and an organic light-emitting material layer disposed between the anode pattern and the cathode pattern, and the anode pattern is electrically connected to an output electrode of the driving transistor corresponding to the light-emitting unit.

Based on the above technical solution of the display substrate, a display device including the above display substrate is provided in a second aspect of the present disclosure.

Based on the above technical solution of the display substrate, a method for manufacturing the above display substrate is provided in a third aspect of the present disclosure. The method includes a step of forming the pixel definition layer and the encapsulation layer, and the step specifically includes:
 forming the pixel definition layer, and forming the diversion channel on the surface of the pixel definition layer that is away from the base of the display substrate, wherein the pixel definition layer defines the pixel opening region for accommodating the light-emitting unit in the display substrate;
 disposing an encapsulation material on a side of the pixel definition layer that is away from the base, wherein the encapsulation material levels out on the side of the pixel definition layer that is away from the base via the diversion channel to cover an entirety of both the light-emitting unit and the pixel definition layer; and
 curing the leveled-out encapsulation material to form the encapsulation layer.

Optionally, the disposing the encapsulation material on the side of the pixel definition layer that is away from the base includes: printing, in an inkjet printing process, the encapsulation material on the side of the pixel definition layer that is away from the base.

Optionally, when the diversion channel includes a groove structure, the forming the pixel definition layer, and forming the diversion channel on the surface of the pixel definition layer that is away from the base of the display substrate includes:
 forming a pixel definition film; and
 patterning the pixel definition film by using a halftone mask, to form the pixel definition layer and the groove structure simultaneously in one patterning process.

Optionally, the pixel definition film is made of a photosensitive resin material, the patterning the pixel definition film by using the halftone mask, to form the pixel definition layer and the groove structure simultaneously in one patterning process includes:

exposing the pixel definition film by using the halftone mask, to form a pixel definition film fully-remaining region, a pixel definition film partially-remaining region and a pixel definition film removed region, wherein the pixel definition film fully-remaining region corresponds to a region in the pixel definition layer other than a region where the groove structure is located, and the pixel definition film partially-remaining region corresponds to the groove structure; and developing the exposed pixel definition film by using developer to remove partially the pixel definition film in the pixel definition film partially-remaining region, and remove fully the pixel definition film in the pixel definition film removed region, such that the pixel definition layer and the groove structure are formed.

Optionally, when the display substrate includes a thin film transistor array layer, and the light-emitting unit includes an anode pattern, an organic light-emitting material layer, and a cathode pattern, the method further includes:

before forming the pixel definition layer, forming the thin film transistor array layer on the base, wherein the thin film transistor array layer includes a driving transistor in a one-to-one correspondence with the light-emitting unit; and forming the anode pattern electrically connected to the driving transistor in a one-to-one correspondence;

and, after forming the pixel definition layer, revealing, at the pixel opening region defined by the pixel definition layer, at least a portion of the corresponding anode pattern, forming the organic light-emitting material layer on a surface of the revealed anode pattern that is away from the base; and forming the cathode pattern on a surface of the organic light-emitting material layer that is away from the base.

BRIEF DESCRIPTION OF THE DRAWINGS

The drawings described herein are used to provide a further understanding of the present disclosure and constitute a part of the present disclosure. The exemplary embodiments of the present disclosure and the description thereof are used to explain the present disclosure, and do not constitute an undue limitation on the present disclosure. In the drawings.

DETAILED DESCRIPTION

Figure 1:
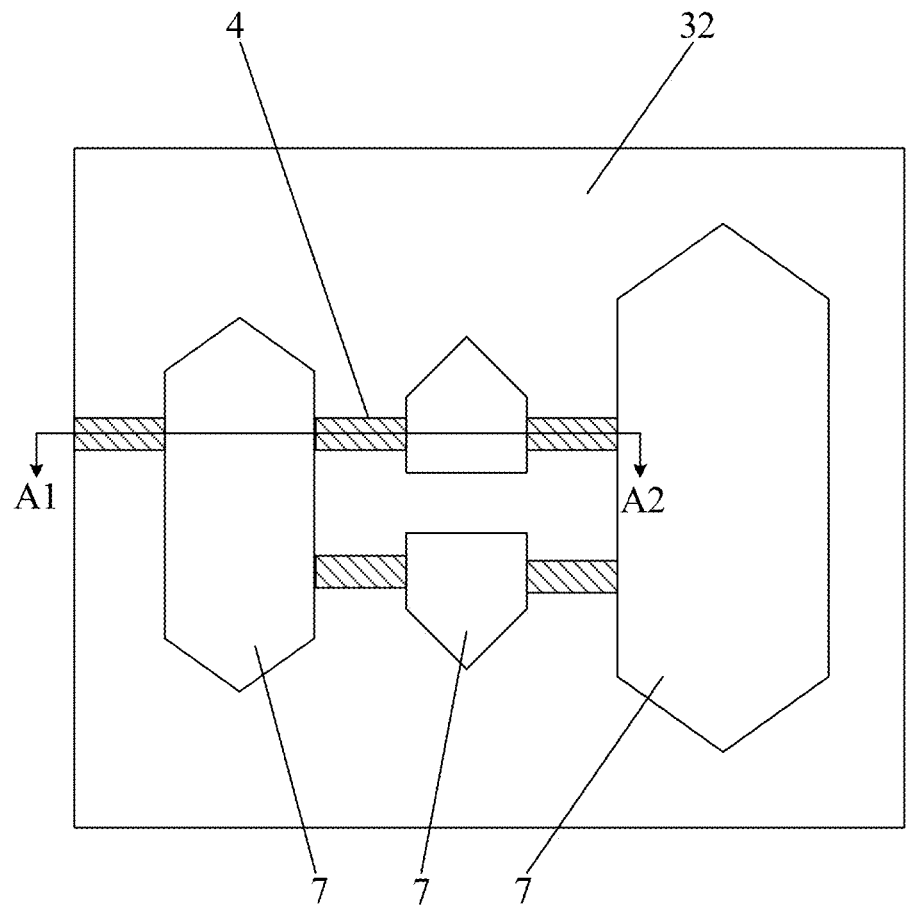
FIG. 1 is a schematic connection diagram of a diversion channel connecting pixel opening regions in some embodiments of the present disclosure.
Figure 2:
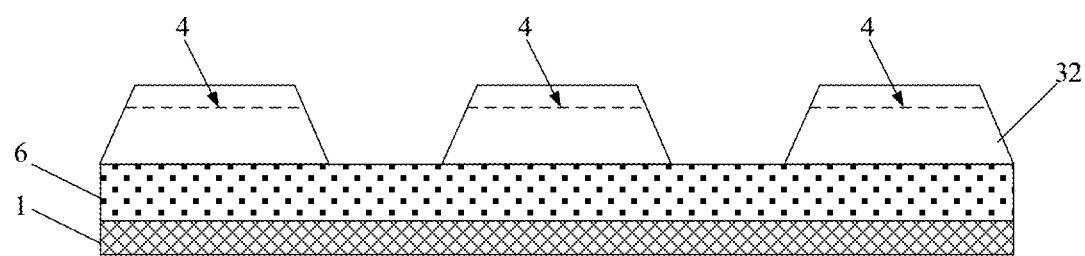
FIG. 2 is a schematic sectional view taken along a direction A1A2 in FIG. 1.

In order to further explain the display substrate, the method for manufacturing the same and the display device in the embodiments of the present disclosure, detailed descriptions are given below with reference to the accompanying drawings.

In the related art, in order to prevent moisture and oxygen from affecting an organic light-emitting material layer in an OLED display product, a thin-film encapsulation is generally performed on the OLED display product. A specific process of the thin-film encapsulation includes: firstly forming an inorganic encapsulation thin film, and then continuing to form an organic encapsulation thin film on the inorganic encapsulation thin film. When the organic encapsulation thin film is formed, a colorless and transparent liquid organic material may be printed on the inorganic encapsulation thin film through an inkjet printing process. After the liquid organic material flows freely for a while, that is, when the liquid organic material covers all the light-emitting units, the liquid organic material is cured to form the organic encapsulation thin film. However, the organic encapsulation thin film formed in the above process has poor surface flatness, thereby reducing production yield of display devices.

However, reasons for the poor surface flatness of the organic encapsulation thin film are as follows: an OLED display device includes light-emitting units of different colors, such as a red light-emitting unit, a green light-emitting unit and a blue light-emitting unit, and due to limitation of the organic light-emitting material, an area of the green light-emitting unit is much smaller than an area of the red light-emitting unit and an area of the blue light-emitting unit, as a result, when the organic encapsulation thin film is formed, a leveling effect of the liquid organic material at the green light-emitting unit is worse than that of the liquid organic material at the red light-emitting unit and the blue light-emitting unit, which in turn causes a thickness of the organic encapsulation thin film at the red light-emitting unit and the blue light-emitting unit to be different from a thickness of the organic encapsulation thin film at the green light-emitting unit. As a result, pits or orange peel-like defects appear on the surface of the organic encapsulation thin film, which affects the production yield of display products.

Therefore, a diversion channel may be formed between adjacent light-emitting units, so that the liquid organic material levels out in an entire area to be encapsulated via the diversion channel, thereby ensuring the flatness of the formed organic encapsulation thin film.

Referring to FIG. 1, FIG. 2, FIG. 5 and FIG. 9, a display substrate is provided in some embodiments of the present disclosure. The display substrate includes a base 1, a pixel definition layer 32 disposed on the base 1, and a light-emitting unit 2 disposed in a pixel opening region 7 defined by the pixel definition layer 32. The display substrate further includes: a diversion channel 4 provided on a surface of the pixel definition layer 32 that is away from the base 1; and an encapsulation layer 8 covering the light-emitting unit 2 and the pixel definition layer 32, wherein the encapsulation layer 8 fills the diversion channel 4.

Specifically, the pixel definition layer 32 disposed on the base 1 defines a plurality of pixel opening regions 7 used for accommodating a plurality of light-emitting units 2 included in the display substrate in a one-to-one correspondence. The diversion channel 4 may be formed on the surface of the pixel definition layer 32 that is away from the base 1. A position and specific structure of the diversion channel 4 may be set according to practical requirements, as long as a diversion function may be realized. The encapsulation layer may include an organic encapsulation layer, which is capable of covering all the light-emitting units 2 in the display substrate as well as the pixel definition layer 32 to prevent external moisture and oxygen from intruding into interior of a light-emitting unit 2 during production and application of the display substrate and thus affecting service life of the light-emitting unit 2.

It is worth noting that, the encapsulation layer may further include an inorganic encapsulation layer, and the quantity of the inorganic encapsulation layers may be set according to practical requirements. For example, when a thin film encapsulation operation is performed, firstly, a first inorganic encapsulation layer covering all the light-emitting units 2 and the pixel definition layer 32 may be formed, a part of the first inorganic encapsulation layer fills the diversion channel 4, but does not fill up the diversion channel 4; and then an organic encapsulation layer is formed on a surface of the first inorganic encapsulation layer that is away from the base 1, when the organic encapsulation layer is formed, the diversion channel 4 may effectively realize a diversion of the liquid organic encapsulation material, thereby ensuring that the surface of the formed organic encapsulation layer that is away from the base 1 has a high flatness; finally, a second inorganic encapsulation layer may be formed on a surface of the organic encapsulation layer that is away from the base 1 to complete encapsulation of the display substrate.

The manufacturing and encapsulation process of the display substrate is described in the following by taking the encapsulation layer including the organic encapsulation layer as an example.

The manufacturing and encapsulation process of the display substrate includes: providing the base 1 on which other functional film layers, such as a buffer layer, a thin film transistor array layer, etc., may be formed in advance; forming the pixel definition layer 32 on a side of the base 1 where the other functional film layers are formed, and forming the diversion channel 4 on the surface of the pixel definition layer 32 that is away from the base 1, the formed pixel definition layer 32 defines the pixel opening region 7 for accommodating the light-emitting unit 2 in the display substrate; after forming the light-emitting units 2 in the pixel opening regions 7 in a one-to-one correspondence, printing the organic encapsulation material on the side of the pixel definition layer 32 that is away from the base 1 in an inkjet printing process, where the organic encapsulation material levels out on the side of the pixel definition layer 32 that is away from the base 1 via the diversion channel 4 to cover all the light-emitting units 2 and the pixel definition layer 32; finally, curing the leveled-out encapsulation material to form the encapsulation layer.

It can be seen from the specific structure of the display substrate and the manufacturing and encapsulation process thereof, in the display substrate of the embodiment of the present disclosure, the diversion channel 4 is provided on the surface of the pixel definition layer 32 that is away from the base 1, such that when forming the encapsulation layer, the encapsulation material may level out on the side of the pixel definition layer 32 that is away from the base 1 via the diversion channel 4, thereby after curing the encapsulation material to form the encapsulation layer, the surface of the encapsulation layer that is away from the base 1 has good flatness, which effectively improves the production yield of the display substrates and reduces production losses.

Specific structures of the diversion channel 4 in the embodiments are various. In some embodiments, the diversion channel 4 may be provided to include a groove structure.

Figure 4:
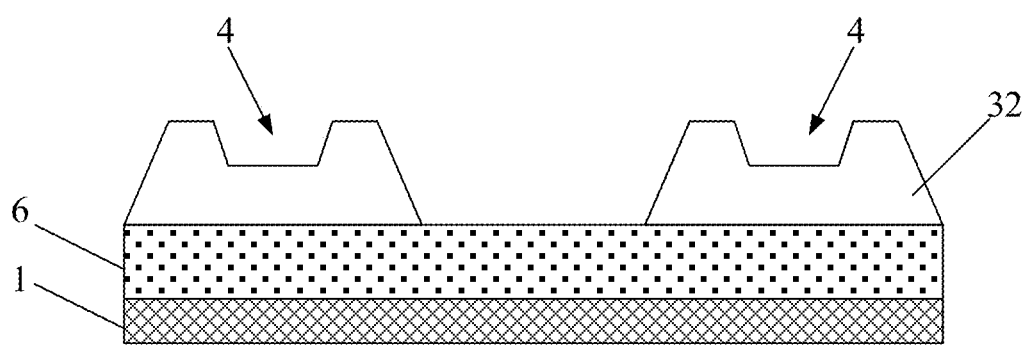
FIG. 4 is a schematic sectional view taken along a direction B1B2 in FIG. 3.

Specifically, as shown in FIG. 4, when the diversion channel 4 is provided with the groove structure, a specific shape, position and size of the groove structure may be set according to practical requirements. In addition, an opening of the groove structure is toward a side for forming the encapsulation layer. When forming the encapsulation layer in the inkjet printing process, the liquid encapsulation material may better level out via the diversion channel 4, so that after curing the encapsulation material to form the encapsulation layer, the surface of the encapsulation layer that is away from the base 1 has good flatness.

Figure 8:
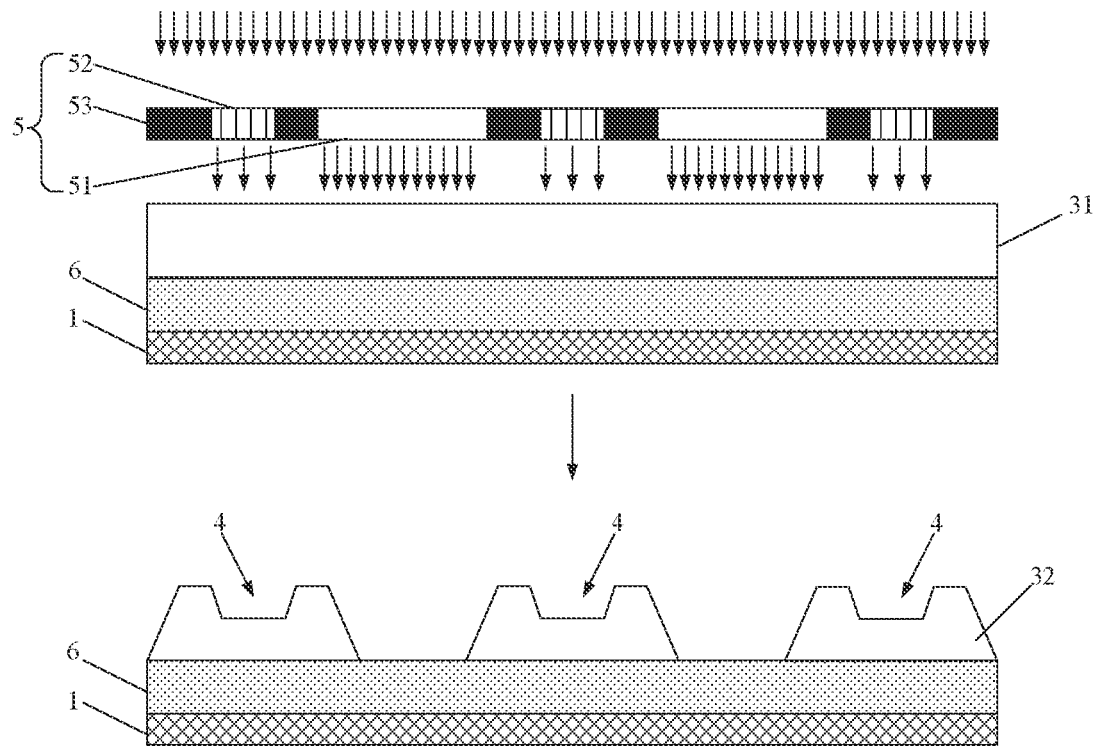
FIG. 8 is a schematic flowchart of forming a pixel definition layer and a groove structure in some embodiments of the present disclosure.
Figure 9:
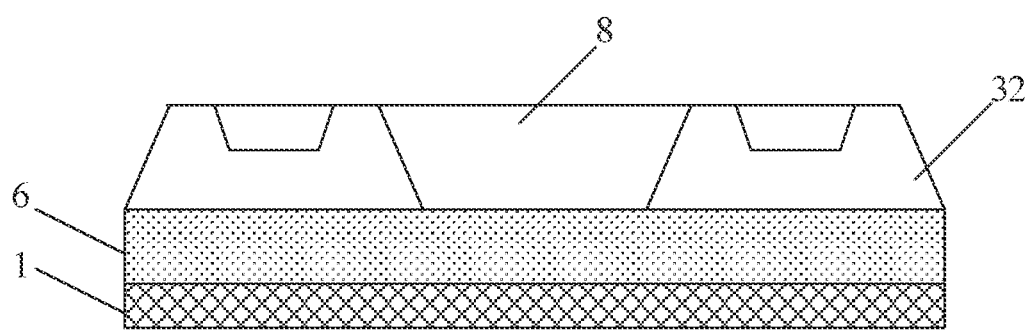
FIG. 9 is another schematic sectional view taken along a direction B1B2 in FIG. 3.

In addition, when the diversion channel 4 is provided with the groove structure, the groove structure and the pixel definition layer 32 may be formed simultaneously in one patterning process. More specifically, as shown in FIG. 8, a pixel definition film 31 is made of a photosensitive resin material (for example, photoresist), and then a halftone mask 5 (including a fully transparent region 51, a partially transparent region 52 and a light-shielding region 53) is aligned with the pixel definition film 31. The pixel definition film 31 is exposed by using the halftone mask 5, to form a pixel definition film fully-remaining region, a pixel definition film partially-remaining region and a pixel definition film removed region, where the pixel definition film fully-remaining region corresponds to a region in the pixel definition layer 32 other than a region where the groove structure is located, the pixel definition film partially-remaining region corresponds to the groove structure, and the pixel definition film removed region corresponds to a region other than the region where the pixel definition thin layer 32 and the groove structure are located. The exposed pixel definition film is developed by using developer, to remove partially the pixel definition film 31 in the pixel definition film partially-remaining region, and remove fully the pixel definition film 31 in the pixel definition film removed region, and the pixel definition layer 32 and the groove structure on the surface of the pixel definition layer 32 that is away from the base 1 are formed finally.

It can be seen that when the diversion channel 4 in the above embodiment is provided with the groove structure, not only the flatness of the formed encapsulation layer is ensured, but also the diversion channel 4 and the pixel definition layer 32 may be formed in a same patterning process. It is not necessary to introduce new material for forming the diversion channel 4, thereby avoiding additional processes for forming the diversion channel 4, further simplifying the process and reducing production costs.

As shown in FIG. 1 to FIG. 4, in some embodiments, the diversion channels 4 in the above embodiment may be provided to connect adjacent pixel opening regions 7.

Since the pixel definition layer 32 is used to define the pixel opening region 7 for accommodating the light-emitting unit 2, the pixel definition layer 32 includes a barrier wall between the pixel opening regions 7, and in order to avoid a color mixing phenomenon occurring between the light-emitting units 2 formed in the adjacent pixel opening regions 7, a height of the barrier wall in a direction perpendicular to the base 1 is higher than a height of the light-emitting unit 2 in a direction perpendicular to the base 1, so that the barrier wall has a certain blocking effect on the encapsulation material used to form the encapsulation layer, which is not conducive to the leveling of the encapsulation material.

The diversion channels 4 are provided to connect the adjacent pixel opening regions 7, so that the encapsulation materials located in adjacent pixel opening regions 7 may merge via the diversion channels 4, as a result, thicknesses of the encapsulation materials located in various parts of the display substrate are uniform, and the surface of the finally formed encapsulation layer has good flatness.

Further, the adjacent pixel opening regions 7 may be set to include a target pixel opening region and a non-target pixel opening region, and an opening area of the non-target pixel opening region is larger than an opening area of the target pixel opening region.

Specifically, the display substrate generally includes a plurality of light-emitting units 2 capable of emitting light of different colors, and each light-emitting unit 2 emits light due to an organic light-emitting material layer included in the light-emitting unit 2. Limited by the characteristics of the organic light-emitting materials corresponding to different colors, when actually manufacturing the display device, areas of the organic light-emitting material layers corresponding to the light-emitting units 2 of different colors are different, and opening areas of corresponding pixel opening regions 7 for accommodating the light-emitting units 2 of different colors are different. In a process of thin film encapsulation, a leveling effect of the encapsulation material at the pixel opening region 7 having a large opening area (for example, the pixel opening region accommodating the red light-emitting unit or the blue light-emitting unit) is good, while a leveling effect of the encapsulation material at the pixel opening region 7 having a small opening area (for example, the pixel opening region accommodating the blue light-emitting unit) is poor, which in turn causes a thickness of the encapsulation layer at the red light-emitting unit 2 and the blue light-emitting unit 2 to be different from a thickness of the encapsulation layer at the green light-emitting unit 2.

The diversion channel 4 is provided to connect the adjacent target pixel opening region and the non-target pixel opening region, such that the diversion channel 4 connects the pixel opening region 7 having larger opening area and the pixel opening region 7 having smaller opening area, and the encapsulation material levels out on the entire encapsulation surface via the diversion channel 4, thus it is ensured that the thicknesses, in various parts of the display substrate, of the formed encapsulation layer remain uniform, and the surface of the encapsulation layer have good flatness.

Figure 3:
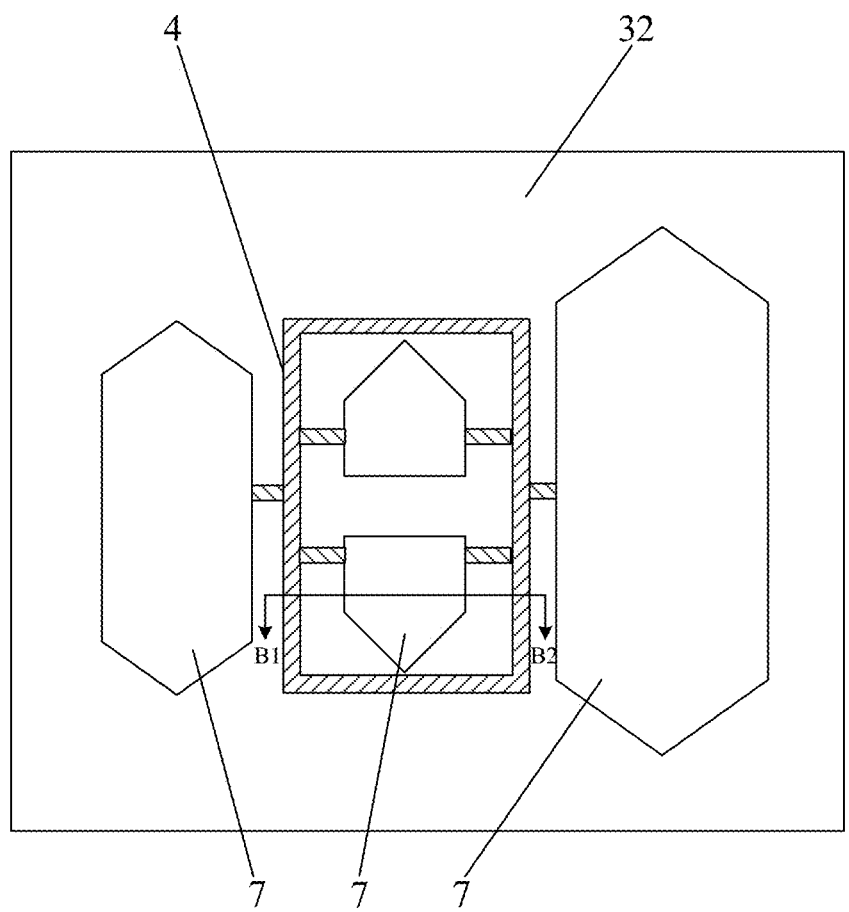
FIG. 3 is another schematic connection diagram of a diversion channel connecting pixel opening regions in some embodiments of the present disclosure.

In some embodiments, an orthographic projection of the diversion channel 4 provided in the foregoing embodiment on the base 1 may be set to surround an orthographic projection of the target pixel opening region on the base 1, as shown in FIG. 3. Moreover, a depth of the diversion channel 4 in a direction perpendicular to the base 1 is gradually increased along a first direction; the first direction includes a direction from the non-target pixel opening region to the target pixel opening region.

Specifically, the diversion channel 4 may connect the target pixel opening region and the non-target pixel opening region in various ways. For example, the orthographic projection of the diversion channel 4 on the base 1 may be set to surround the orthographic projection of the target pixel opening region on the base 1, in this way, the diversion channel 4 may surround the target pixel opening region, such that the diversion channel 4 may realize diversion of the encapsulation material at any position around the target pixel opening region, which better guarantees the thickness uniformity of the formed encapsulation layer in various parts of the display substrate, thereby providing the surface of the encapsulation layer with good flatness.

Further, the depth of the diversion channel 4 in the direction perpendicular to the base 1 is set to be gradually increased along the direction from the non-target pixel opening region to the target pixel opening region, such that the diversion channel 4 has a greater diversion ability near the target pixel opening region, the encapsulation material levels out better on the entire encapsulation surface via the diversion channel 4, thereby providing the surface of the encapsulation layer with better flatness.

Figure 5:
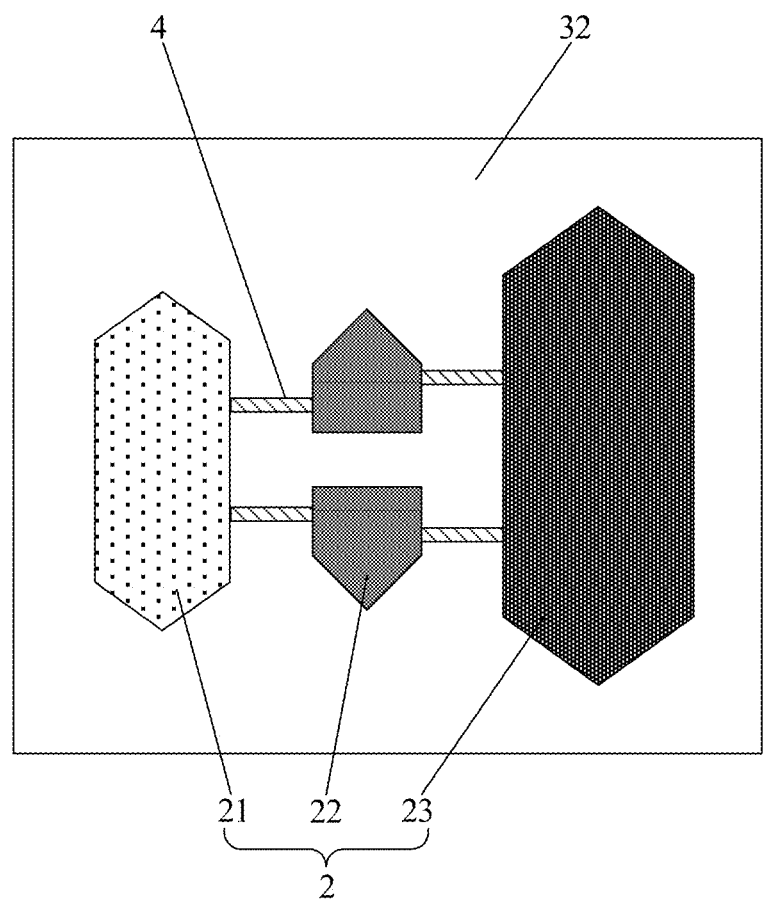
FIG. 5 is a schematic top view of a display substrate in a first connection mode in some embodiments of the present disclosure.
Figure 6:
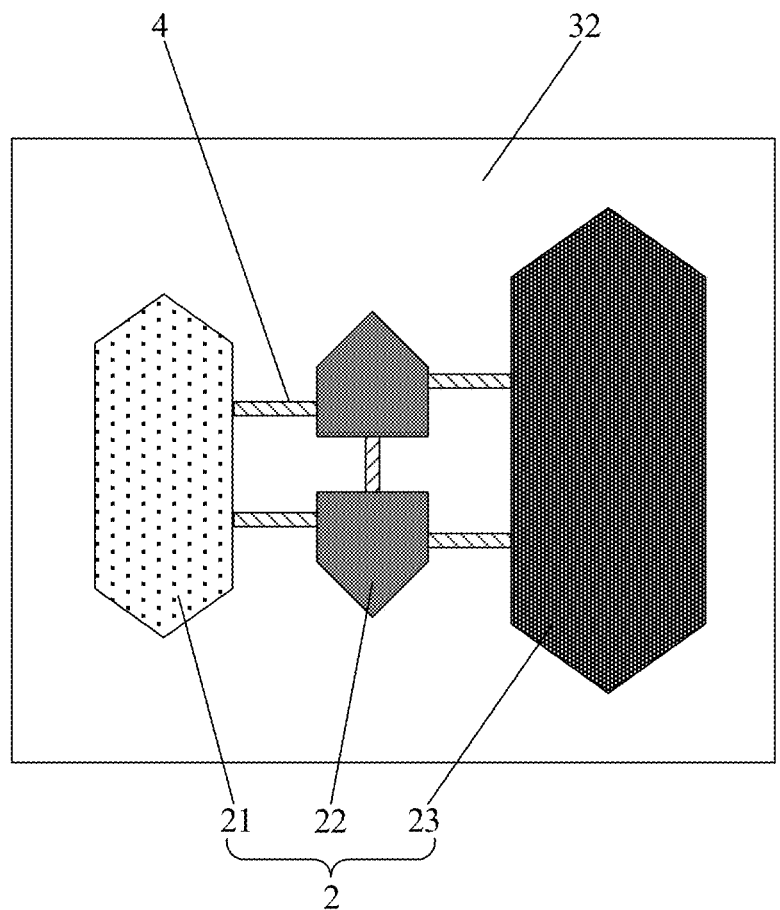
FIG. 6 is a schematic top view of a display substrate in a second connection mode in some embodiments of the present disclosure.
Figure 7:
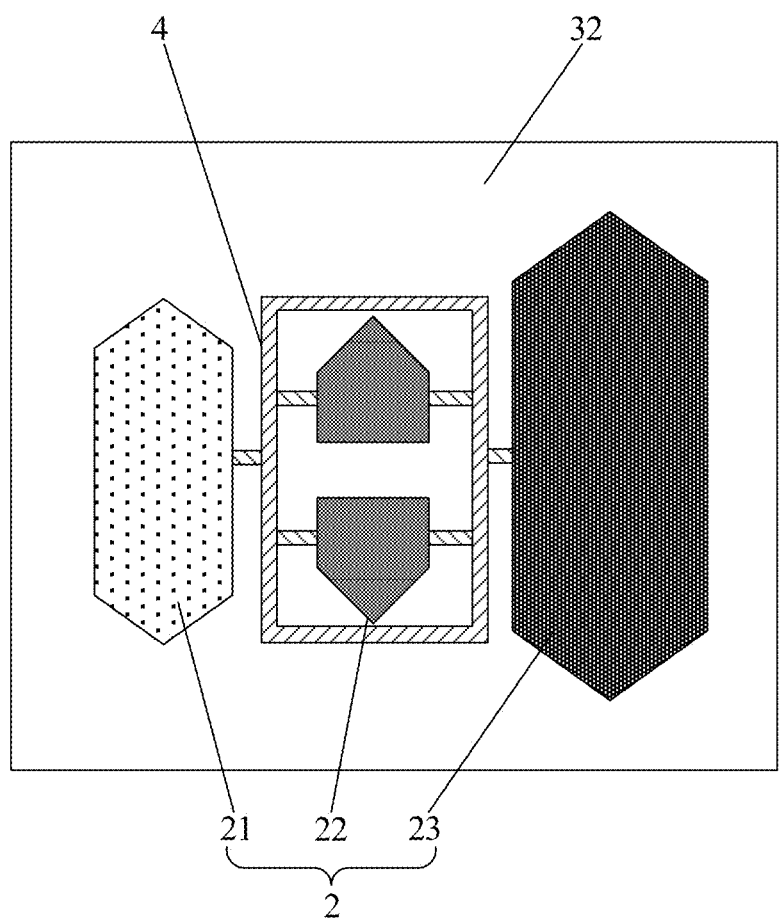
FIG. 7 is a schematic top view of a display substrate in a third connection mode in some embodiments of the present disclosure.

As shown in FIG. 5 to FIG. 7, in some embodiments, the light-emitting units 2 in the above embodiment include a red light-emitting unit 21, a green light-emitting unit 22, and a blue light-emitting unit 23. The green light-emitting unit 22 is located in the target pixel opening region, and both the red light-emitting unit 21 and the blue light-emitting unit 23 are located in the non-target pixel opening region.

Specifically, when the light-emitting units 2 in the display substrate include the red light-emitting unit 21, the green light-emitting unit 22, and the blue light-emitting unit 23, due to limitation of the organic light-emitting materials of the light-emitting units 2, an area of the green light-emitting unit 22 is generally smaller than an area of the red light-emitting unit 21 and an area of the blue light-emitting unit 23. Therefore, the green light-emitting unit 22 may be disposed in the target pixel opening region, and both the red light-emitting unit 21 and the blue light-emitting unit 23 are disposed in the non-target pixel opening region, such that the encapsulation material levels out better between the green light-emitting unit 22 and the red light-emitting unit 21 or the blue light-emitting unit 23, thereby providing the surface of the encapsulation layer with better flatness.

More specifically, when different light-emitting units 2 are connected via the diversion channel 4, the following connection modes may be implemented, but the present disclosure is not limited thereto. A first connection mode includes: as shown in FIG. 5, the pixel opening region 7 for accommodating the red light-emitting unit 21 and the pixel opening region 7 for accommodating the green light-emitting unit 22 are connected via the diversion channel 4, and the pixel opening region 7 for accommodating the green light-emitting unit 22 and the pixel opening region 7 for accommodating the blue light-emitting unit 23 are connected via the diversion channel 4. A second connection method includes: as shown in FIG. 6, the pixel opening region 7 for accommodating the red light-emitting unit 21 and the pixel opening region 7 for accommodating the green light-emitting unit 22 are connected via the diversion channel 4, the pixel opening region 7 for accommodating the green light-emitting unit 22 and the pixel opening region 7 for accommodating the green light-emitting unit 22 are connected via the diversion channel 4, and the pixel opening region 7 for accommodating the green light-emitting unit 22 and the pixel opening region 7 for accommodating the blue light-emitting unit 23 are connected via the diversion channel 4.

It's worth noting that a size of the pixel definition layer 32 and a size of the groove structure may be set according to practical requirements. For example, a maximum thickness of the pixel definition layer 32 (i.e., a thickness of a part of the pixel definition layer 32 other than the groove structure) in a direction perpendicular to the base 1 may be set to range from 1.5 µm to 2 µm, and a maximum depth of the groove structure in a direction perpendicular to the base 1 may be set to range from 0.5 µm to A thickness of a groove bottom of the groove structure in the direction perpendicular to the base 1 may further be set to about 1 µm. In addition, a width of the groove structure in a direction perpendicular to an extending direction of the groove structure may be set to range from 1 µm to 1.5 µm, and thus problems such as light leakage caused by the groove structure being too wide may be avoided.

The pixel definition layer 32 and the groove structure are designed to have the above sizes, so that, while realizing the diversion function, the groove structure does not affect the manufacturing process of the light-emitting units 2, and does not cause light leakage and light mixing of the light-emitting units 2, thereby ensuring the good flatness of the encapsulation layer while ensuring a normal display function of the display substrate.

As shown in FIG. 8, in some embodiments, the display substrate in the above embodiment may further include: a thin film transistor array layer 6 disposed between the base 1 and the pixel definition layer 32. The thin film transistor array layer 6 including a driving transistor in a one-to-one correspondence with the light-emitting unit 2; the light-emitting unit 2 in the above embodiment includes an anode pattern and a cathode pattern disposed oppositely, and an organic light-emitting material layer disposed between the anode pattern and the cathode pattern, where the anode pattern is electrically connected to an output electrode of the driving transistor corresponding to the light-emitting unit.

Specifically, the thin film transistor array layer 6 in the above embodiment may include a plurality of driving transistors distributed in an array, and each driving transistor may include a gate electrode, a gate insulation layer, an active layer, an interlayer insulation layer, a source electrode layer and a drain electrode layer, where one of the source electrode layer and the drain electrode layer serves as the output electrode of the driving transistor, and the other of the source electrode layer and the drain electrode layer serves as an input electrode of the driving transistor. The above display substrate may further include a planarization layer disposed on a surface of the thin film transistor array layer 6 that is away from the base 1, and via-holes in a one-to-one correspondence with the output electrodes of the driving transistors are formed on the planarization layer, and each via-hole may reveal the corresponding output electrode of the driving transistor. The anode pattern included in the light-emitting unit 2 may be located on a side of the thin film transistor array layer 6 that is away from the base 1, and the anode pattern is electrically connected to the output electrode of the corresponding driving transistor through the corresponding via-hole. The pixel definition layer 32 may be provided on a side of the planarization layer that is away from the base 1. The pixel definition layer 32 may be made of a photosensitive resin material. The pixel definition layer 32 defines the plurality of pixel opening regions 7, and the pixel opening region 7 reveals at least a portion of the anode pattern in a one-to-one correspondence. The organic light-emitting material layer and the cathode pattern in the light-emitting unit 2 are sequentially superposed on the revealed surface of the anode pattern.

A display device including the display substrate in the above embodiments is further provided in some embodiments of the present disclosure.

In the display substrate of the above embodiment, the diversion channel 4 is provided on the surface of the pixel definition layer 32 that is away from the base 1, so that when forming the encapsulation layer, the encapsulation material may level out on the side of the pixel definition layer 32 that is away from the base 1 via the diversion channel 4, and after curing the encapsulation material to form the encapsulation layer, the surface of the encapsulation layer that is away from the base 1 has good flatness, which effectively improves the production yield of the display substrates. Therefore, when the display device in the embodiment of the present disclosure includes the display substrate in the above embodiment, the above beneficial effects are also provided, which are not repeated herein.

It should be noted that the display device may be any product or component having a display function, such as a television, a display, a digital photo frame, a mobile phone, or a tablet computer.

A method for manufacturing the display substrate in the above embodiment is further provided in some embodiments of the present disclosure. The method includes a step of forming the pixel definition layer 32 and the encapsulation layer, and the step specifically includes: forming the pixel definition layer 32, and forming the diversion channel 4 on the surface of the pixel definition layer 32 that is away from the base 1 of the display substrate, the pixel definition layer 32 defines the pixel opening region 7 for accommodating the light-emitting unit 2 in the display substrate; disposing an encapsulation material on a side of the pixel definition layer 32 that is away from the base 1, where the encapsulation material levels out on the side of the pixel definition layer 32 that is away from the base 1 via the diversion channel 4 to cover all the light-emitting units 2 and the pixel definition layer 32; and curing the leveled-out encapsulation material to form the encapsulation layer.

In some embodiments, the encapsulation material may be printed on the side of the pixel definition layer that is away from the base in an inkjet printing process.

Specifically, the pixel definition layer 32 may be made of a photosensitive resin material, and the formed pixel definition layer 32 may define a plurality of pixel opening regions 7 used for accommodating a plurality of light-emitting units 2 included in the display substrate in a one-to-one correspondence. The diversion channel 4 may be formed on the surface of the pixel definition layer 32 that is away from the base 1. A position and specific structure of the diversion channel 4 may be set according to practical requirements, as long as a diversion function may be realized. The encapsulation layer may include an organic encapsulation layer, which may cover all the light-emitting units 2 in the display substrate as well as the pixel definition layer 32, to prevent external moisture and oxygen from intruding into interior of a light-emitting unit 2 during production and application of the display substrate and affecting service life of the light-emitting unit 2.

It is worth noting that the encapsulation layer may further include an inorganic encapsulation layer, and the quantity of the inorganic encapsulation layers may be set according to practical requirements. For example, when a thin film encapsulation operation is performed, firstly, a first inorganic encapsulation layer covering all the light-emitting units 2 and the pixel definition layer 32 may be formed, a part of the first inorganic encapsulation layer fills the diversion channel 4, but does not fill up the diversion channel 4; and then an organic encapsulation layer is formed on a surface of the first inorganic encapsulation layer that is away from the base 1, when the organic encapsulation layer is formed, the diversion channel 4 may effectively realize a diversion of the liquid organic encapsulation material, thereby ensuring that the surface of the formed organic encapsulation layer that is away from the base 1 has a higher flatness; finally, a second inorganic encapsulation layer may be formed on a surface of the organic encapsulation layer that is away from the base 1 to complete encapsulation of the display substrate.

More specifically, the method in the above embodiment includes: providing the base 1, on which other functional film layers, such as a buffer layer, a thin film transistor array layer 6, etc., may be formed in advance; forming the pixel definition layer 32 on a side of the base 1 where the other functional film layers are formed, and forming the diversion channel 4 on the surface of the pixel definition layer 32 that is away from the base 1, the formed pixel definition layer 32 defines the pixel opening region 7 for accommodating the light-emitting unit 2 in the display substrate; after forming the light-emitting units 2 in pixel opening regions 7 in a one-to-one correspondence, printing the organic encapsulation material on the side of the pixel definition layer 32 that is away from the base 1 in an inkjet printing process, where the organic encapsulation material levels out on the side of the pixel definition layer 32 that is away from the base 1 via the diversion channel 4 to cover all the light-emitting units 2 and the pixel definition layer 32; finally, curing the leveled-out encapsulation material to form the encapsulation layer.

In the display substrate manufactured by using the method of the embodiments of the present disclosure, the diversion channel 4 is provided on the surface of the pixel definition layer 32 that is away from the base 1, such that when forming the encapsulation layer, the encapsulation material may level out on the side of the pixel definition layer 32 that is away from the base 1 via the diversion channel 4, and after curing the encapsulation material to form the encapsulation layer, the surface of the encapsulation layer that is away from the base 1 has good flatness, which effectively improves the production yield of display substrates and reduces production losses.

As shown in FIG. 8, in some embodiments, when the diversion channel 4 includes a groove structure, the step of forming the pixel definition layer 32 and the diversion channel 4 specifically includes: forming a pixel definition film 31; and patterning the pixel definition film by using a halftone mask 5, to form the pixel definition layer 32 and the groove structure simultaneously in one patterning process.

Specifically, when the diversion channel 4 is provided with the groove structure, a specific shape, position and size of the groove structure may be set according to practical requirements. In addition, an opening of the groove structure is toward a side for forming the encapsulation layer. When the encapsulation layer is formed in the inkjet printing process, the liquid encapsulation material may better level out via the diversion channel 4, so that after curing the encapsulation material to form the encapsulation layer, the surface of the encapsulation layer that is away from the base 1 has good flatness.

When the diversion channel 4 is provided with the groove structure, the groove structure and the pixel definition layer 32 may be formed simultaneously in one patterning process. More specifically, the pixel definition film may be made of a photosensitive resin material (for example, photoresist), and then a halftone mask 5 (including a fully transparent region 51, a partially transparent region 52 and a light-shielding region 53) is aligned with the pixel definition film. The pixel definition film is exposed by using the halftone mask 5, to form a pixel definition film fully-remaining region, a pixel definition film partially-remaining region and a pixel definition film removed region, where the pixel definition film fully-remaining region corresponds to a region in the pixel definition layer 32 other than a region where the groove structure is located, the pixel definition film partially-remaining region corresponds to the groove structure, and the pixel definition film removed region corresponds to a region other than the region where the pixel definition thin layer 32 and the groove structure are located. The exposed pixel definition film is developed by using developer, to partially remove the pixel definition film in the pixel definition film partially-remaining region, and fully remove the pixel definition film in the pixel definition film removed region, and finally the pixel definition layer 32 and the groove structure on the surface of the pixel definition layer 32 that is away from the base 1 are formed.

It can be seen that, when the groove structure is formed by using the method in the above embodiment, not only the flatness of the formed encapsulation layer is ensured, but also the diversion channel 4 and the pixel definition layer 32 may be formed in a same patterning process. It is not necessary to introduce new material for forming the diversion channel 4, thereby avoiding additional processes for forming the diversion channel 4, which further simplifies the process and reduces production costs.

It is worth noting that when the display substrate is manufactured by using the method in the above embodiment, the formed diversion channels 4 may connect adjacent pixel opening regions 7; the adjacent pixel opening regions 7 may include a target pixel opening region and a non-target pixel opening region, and an opening area of the non-target pixel opening region is larger than an opening area of the target pixel opening region. Moreover, an orthographic projection of the formed diversion channel 4 on the base 1 may surround an orthographic projection of the target pixel opening region on the base 1, and a depth of the diversion channel 4 in a direction perpendicular to the base 1 is gradually increased along a first direction; the first direction includes a direction from the non-target pixel opening region to the target pixel opening region.

In addition, when the display substrate is manufactured by using the method in the above embodiment, a maximum thickness of the formed pixel definition layer 32 in a direction perpendicular to the base 1 may range from 1.5 μm to 2 μm, and a maximum depth of the groove structure in the direction perpendicular to the base 1 may range from 0.5 μm to 1 μm. In addition, a width of the groove structure in a direction perpendicular to an extending direction of the groove structure may range from 1 μm to 1.5 μm, and thus problems such as light leakage caused by the groove structure being too wide may be avoided.

In some embodiments, when the display substrate includes a thin film transistor array layer 6, and the light-emitting unit 2 includes an anode pattern, an organic light-emitting material layer, and a cathode pattern, the method in the above embodiment further includes: before forming the pixel definition layer 32, forming the thin film transistor array layer 6 on the base 1, where the thin film transistor array layer 6 includes a driving transistor corresponding to the light-emitting unit 2 one to one, and forming the anode pattern electrically connected to the driving transistor in a one-to-one correspondence; after forming the pixel definition layer 32, revealing, at the pixel opening region 7 defined by the pixel definition layer 32, at least a portion of corresponding anode pattern, forming the organic light-emitting material layer on a surface of the revealed anode pattern that is away from the base 1; and forming the cathode pattern on a surface of the organic light-emitting material layer that is away from the base 1.

More specifically, the method in the above embodiment includes: firstly, providing the base 1, and forming a thin film transistor array layer 6 on the provided base 1, where the thin film transistor array layer 6 may include a plurality of driving transistors distributed in an array, and each driving transistor includes a gate electrode, a gate insulation layer, an active layer, an interlayer insulation layer, a source electrode layer and a drain electrode layer, one of the source electrode layer and the drain electrode layer serves as the output electrode of the driving transistor, and the other of the source electrode layer and the drain electrode layer serves as an input electrode of the driving transistor; after forming the thin film transistor array layer 6, forming a planarization layer on a surface of the thin film transistor array layer 6 that is away from the base 1, where via-holes in a one-to-one correspondence with the output electrodes of the driving transistors are formed on the planarization layer, and each via-hole may reveal the corresponding output electrode of the driving transistor; and then forming the anode pattern in a one-to-one correspondence with the driving transistor on a surface of the planarization layer that is away from the base 1, where the anode pattern is electrically connected to the output electrode of the corresponding driving transistor through corresponding via hole.

After forming the anode pattern, a photosensitive resin thin film covering the entire anode pattern is formed, and then the photosensitive resin thin film is patterned to obtain the pixel definition layer 32 and the groove structure, where the pixel definition layer 32 defines the plurality of pixel opening regions 7, the pixel opening region 7 reveals at least a portion of the anode pattern in a one-to-one correspondence; then the organic light-emitting material layer may be formed on the surface of the at least a portion of the anode pattern that is away from the base 1, and the cathode pattern is formed on the side of organic light-emitting material layer that is away from the base 1; finally, a thin film encapsulation operation may be performed on the display substrate.

It is worth noting that when the display substrate is manufactured by using the method in the above embodiment, the formed light-emitting units 2 include a red light-emitting unit 21, a green light-emitting unit 22, and a blue light-emitting unit 23, the green light-emitting unit 22 may be formed in the target pixel opening region, and both the red light-emitting unit 21 and the blue light-emitting unit 23 may be formed in the non-target pixel opening region.

It should be noted that each embodiment in the specification is described in a progressive manner, and same or similar parts between various embodiments may be referred to among the embodiments. Each embodiment focuses on the differences from other embodiments. In particular, as for the method embodiment, since it is basically similar to the product embodiment, the method embodiment is described relatively simply, and the relevant part may be referred to in the description of the product embodiment.

Unless defined otherwise, technical or scientific terms used in the present disclosure shall have general meanings as understood by those with ordinary skills in the art. Terms "first", "second" and similar terms used in the present disclosure do not indicate any order, quantity or priority, but are used only for distinguishing different components. An expression such as "include" or "have" indicates that a component or article preceding the term encompasses components, articles or other equivalents listed after the term, without excluding other components or articles. A term "connect", "attach" or other term with similar meaning is not limited to a physical connection or a mechanical connection, but may include an electrical connection, whether direct or indirect. "Up", "down", "left", "right" and the like are only used to represent a relative position relationship. When an absolute position of a described object is changed, the relative position relationship may also change correspondingly.

It should be appreciated that, when a component such as a layer, film, region or substrate is referred to as being located "above" or "below" another component, the component may be "directly" located "above" or "below" another component, or intermediary components may exist.

In the description of the foregoing embodiments, specific features, structures, materials, or characteristics may be combined in a suitable manner in any one or more embodiments or examples.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A display substrate, comprising a base, a pixel definition layer disposed on the base, and a light-emitting unit disposed in a pixel opening region defined by the pixel definition layer, wherein, the display substrate further comprises:
    a diversion channel provided on a surface of the pixel definition layer that is away from the base; and
    an encapsulation layer covering the light-emitting unit and the pixel definition layer, wherein the encapsulation layer fills the diversion channel,
    wherein the diversion channel comprises a groove structure,
    wherein the diversion channel connects adjacent pixel opening regions,
    wherein the adjacent pixel opening regions comprise a target pixel opening region and a non-target pixel opening region, and an opening area of the non-target pixel opening region is larger than an opening area of the target pixel opening region, and
    wherein an orthographic projection of the diversion channel on the base surrounds an orthographic projection of the target pixel opening region on the base, and a depth of the diversion channel in a direction perpendicular to the base is gradually increased along a first direction; the first direction comprises a direction from the non-target pixel opening region to the target pixel opening region.

2. The display substrate according to claim 1, wherein the light-emitting unit comprises a red light-emitting unit, a green light-emitting unit, and a blue light-emitting unit, the green light-emitting unit is located in the target pixel opening region, and both the red light-emitting unit and the blue light-emitting unit are located in the non-target pixel opening region.

3. The display substrate according to claim 1, wherein a maximum thickness of the pixel definition layer in a direction perpendicular to the base ranges from 1.5 μm to 2 μm, and a maximum depth of the groove structure in the direction perpendicular to the base ranges from 0.5 μm to 1 μm.

4. The display substrate according to claim 3, wherein a width of the groove structure in a direction perpendicular to an extending direction of the groove structure ranges from 1 μm to 1.5 μm.

5. The display substrate according to claim 1, further comprising:
- a thin film transistor array layer disposed between the base and the pixel definition layer, wherein the thin film transistor array layer comprises a driving transistor in a one-to-one correspondence with the light-emitting unit;
- the light-emitting unit comprises an anode pattern and a cathode pattern disposed oppositely, and an organic light-emitting material layer disposed between the anode pattern and the cathode pattern, and the anode pattern is electrically connected to an output electrode of the driving transistor corresponding to the light-emitting unit.

6. A display device comprising the display substrate according to claim 1.

7. A method for manufacturing the display substrate according to claim 1, comprising:
- forming the pixel definition layer, and forming the diversion channel on the surface of the pixel definition layer that is away from the base of the display substrate, wherein the pixel definition layer defines the pixel opening region for accommodating the light-emitting unit in the display substrate;
- disposing an encapsulation material on a side of the pixel definition layer that is away from the base, wherein the encapsulation material levels out on the side of the pixel definition layer that is away from the base via the diversion channel, to cover an entirety of both the light-emitting unit and the pixel definition layer; and
- curing the leveled-out encapsulation material, to form the encapsulation layer.

8. The method according to claim 7, wherein the disposing the encapsulation material on the side of the pixel definition layer that is away from the base comprises:
- printing, in an inkjet printing process, the encapsulation material on the side of the pixel definition layer that is away from the base.

9. The method according to claim 8, wherein, when the diversion channel comprises a groove structure, the forming the pixel definition layer, and forming the diversion channel on the surface of the pixel definition layer that is away from the base of the display substrate specifically comprises:
- forming a pixel definition film; and
- patterning the pixel definition film by using a halftone mask, to form the pixel definition layer and the groove structure simultaneously in one patterning process.

10. The method according to claim 9, wherein the pixel definition film is made of a photosensitive resin material,
- the patterning the pixel definition film by using the halftone mask, to form the pixel definition layer and the groove structure simultaneously in one patterning process comprises:
- exposing the pixel definition film by using the halftone mask, to form a pixel definition film fully-remaining region, a pixel definition film partially-remaining region and a pixel definition film removed region, wherein the pixel definition film fully-remaining region corresponds to a region in the pixel definition layer other than a region where the groove structure is located, and the pixel definition film partially-remaining region corresponds to the groove structure; and
- developing the exposed pixel definition film by using developer to remove partially the pixel definition film in the pixel definition film partially-remaining region, and remove fully the pixel definition film in the pixel definition film removed region, such that the pixel definition layer and the groove structure are formed.

11. The method according to claim 7, wherein, when the display substrate comprises a thin film transistor array layer, and the light-emitting unit comprises an anode pattern, an organic light-emitting material layer and a cathode pattern, the method further comprises:
- before forming the pixel definition layer,
- forming the thin film transistor array layer on the base, wherein the thin film transistor array layer comprises a driving transistor in a one-to-one correspondence with the light-emitting unit; and
- forming the anode pattern electrically connected to the driving transistor in a one-to-one correspondence;
- and,
- after forming the pixel definition layer, revealing, at the pixel opening region defined by the pixel definition layer, at least a portion of the corresponding anode pattern,
- forming the organic light-emitting material layer on a surface of the revealed anode pattern that is away from the base; and
- forming the cathode pattern on a surface of the organic light-emitting material layer that is away from the base.

* * * * *